United States Patent
Hsu et al.

(10) Patent No.: US 8,461,883 B2
(45) Date of Patent: Jun. 11, 2013

(54) FREQUENCY GENERATOR

(75) Inventors: Kuo-Ching Hsu, Hsinchu (TW);
Chin-Hsun Hsu, Taipei County (TW);
Tsung-Hau Chang, Hsinchu (TW)

(73) Assignee: Novatek Microelectronics Corp.,
Hsinchu Science Park, Hsin-Chu (TW)

( * ) Notice: Subject to any disclaimer, the term of this patent is extended or adjusted under 35 U.S.C. 154(b) by 218 days.

(21) Appl. No.: 12/773,853

(22) Filed: May 5, 2010

(65) Prior Publication Data
US 2011/0074468 A1 Mar. 31, 2011

(30) Foreign Application Priority Data
Sep. 25, 2009 (TW) .............................. 98132473 A (51) Int. Cl.
*H03B 19/00* (2006.01)
(52) U.S. Cl.
USPC ........................................................ 327/113
(58) Field of Classification Search
USPC ........................................................ 327/113
See application file for complete search history.

(56) References Cited

U.S. PATENT DOCUMENTS

| | | |
|---|---|---|
| 6,744,277 B1 * | 6/2004 | Chang et al. .................... 326/37 |
| 2005/0030114 A1 * | 2/2005 | Starr et al. ...................... 331/78 |

* cited by examiner

*Primary Examiner* — Daniel Rojas
(74) *Attorney, Agent, or Firm* — Winston Hsu; Scott Margo (57) ABSTRACT

A frequency generator is used for generating a frequency within a frequency range. The frequency generator includes a variable current source, a voltage drop generation unit, a voltage source, a detection unit, a conversion unit, and an oscillating circuit. The variable current source is used for outputting a current according to a control signal. The voltage drop generation unit is used for generating a voltage drop according to the current. The voltage source is used for outputting a voltage range. The detection unit is used for outputting the control signal to the variable current source according to a relationship between the voltage drop and the voltage range. The conversion unit is used for outputting a digital code according to the relationship between the voltage drop and the voltage range. The oscillator circuit is used for generating the frequency according to the digital code.

16 Claims, 6 Drawing Sheets

| n=2 | Frequency range | Resistance range | Current | Voltage rande |
|---|---|---|---|---|
| Group 1 | 1~10Hz | 100~10 ohm | 50mA | 0.5V~5V |
| Group 2 | 10~100Hz | 10~1 ohm | 500mA | 0.5V~5V |

FREQUENCY GENERATOR

BACKGROUND OF THE INVENTION

1. Field of the Invention

The present invention relates to a frequency generator, and more particularly, to a frequency generator capable of generating a frequency with a wide frequency range by utilizing an approximating method.

2. Description of the Prior Art

With the evolution of technology, the functions of electronic products are becoming more and more versatile while the sizes of electronic products are becoming more compact and light. These developments may lead to different types of clocks being set on a narrow, small printed circuit board. In order to generate the different types of clocks, a clock generator or an oscillator is a necessary component. However, clock generators and oscillators have frequency jitter problems, which will directly affect accuracy of the generated frequency.

To improve the frequency jitter, several studies have been made: for example, use of a frequency locked-loop (FLL) circuit and a phase locked-loop (PLL) circuit. Although these circuits improve the frequency jitter, the complexity and cost also rises. In the prior art, a clock generation circuit uses a current source to charge a capacitor through a resistor for obtaining a time constant, and a frequency associated with the time constant can be determined. That is, when a smaller resistance or capacitance is used, the capacitor is charged or discharged rapidly, and a higher frequency is generated correspondingly. When a larger resistance or capacitance is used, the capacitor is charged or discharged slowly, and thus a lower frequency is generated. Therefore, when the frequency range of the desired frequency is quite wide, this means that the resistance of the external resistor has a large variation. Since there is a large variation in resistance of the external resistor, the current through the external resistor must vary dramatically. For example, if the clock generator intends to generate a frequency of 1 Hz up to 100 Hz (e.g. the variation ratio of the frequency is 100 times), the variation ratio of the current must reach 100 times as well. It is quite difficult, however, to implement such large current variation on a practical circuit. Moreover, delays in the back stage could cause a different frequency response in both high frequency and low frequency such that the clock generator cannot generate a clock having an accurate frequency and a wide frequency range.

In addition, the external resistor is inversely proportional to the generated frequency. Therefore, when the clock generator generates a high frequency clock, a small variation in the external resistor may cause a large variation in frequency. When the clock generator generates a low frequency clock, a small variation in the external resistor may cause a large variation in frequency. In other words, when the external resistor has small resistance, this means that the clock generator generates a high frequency clock (e.g. high resolution of digital codes). When the external resistor has large resistance, this means that the clock generator generates a low frequency clock (e.g. low resolution of digital codes). Regardless of whether a high frequency or low frequency is generated, the resistance is always measured in the same resolution in the prior art, causing unnecessary resource waste.

In short, when the frequency range generated by the clock generator is quite wide, an external resistor that can vary its resistance significantly must be provided in the prior art. In this situation, large fluctuations in the current through the external resistor occur. It is hard, however, to implement a current source with large variation on the practical circuit. Besides, the clock generator needs different resolution requirements for the high frequency and the low frequency. If the same resolution is used for both cases, the system efficiency may be degraded.

SUMMARY OF THE INVENTION

It is therefore an objective of the present invention to provide a frequency generator to generate an accurate frequency within a frequency range.

The present invention discloses a frequency generator for generating a frequency within a frequency range. The frequency generator comprises a variable current source, a voltage drop generation unit, a voltage source, a detection unit, a conversion unit, and an oscillating circuit. The variable current source is used for selectively outputting a current among a plurality of currents according to a control signal. The voltage drop generation unit is coupled to the variable current source, and used for generating a voltage drop according to the current. The voltage source is used for generating a maximum reference voltage and a minimum reference voltage to output a voltage range. The detection unit is coupled to the voltage drop generation unit and the variable current source, and used for outputting the control signal to the variable current source according to a relationship between the voltage drop and the voltage range. The conversion unit is coupled to the voltage drop generation unit, and used for outputting a digital code according to the relationship between the voltage drop and the voltage range. The oscillating circuit is coupled to the conversion unit, and used for generating the frequency according to the digital code.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
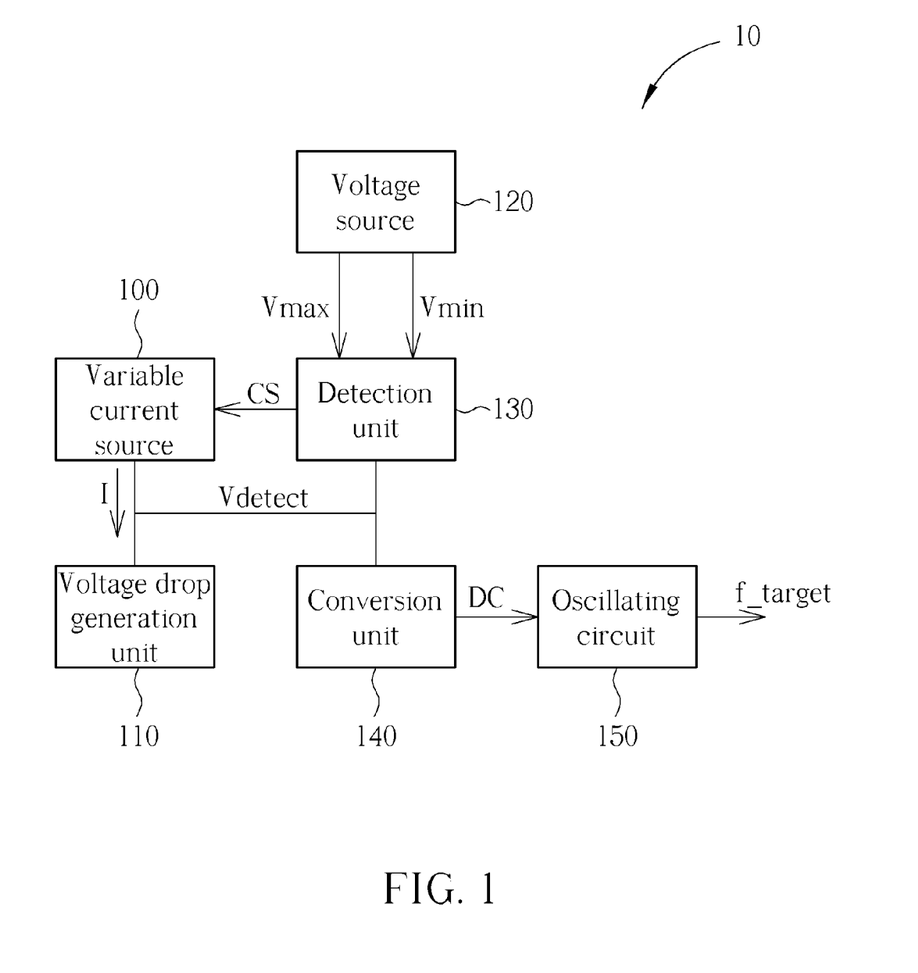
FIG. 1 is a schematic diagram of a frequency generator according to an embodiment of the present invention.

Please refer to FIG. 1, which is a schematic diagram of a frequency generator 10 according to an embodiment of the present invention. The frequency generator 10 could be applied to a regular clock generator or an oscillator to generate a frequency f_target, which is within a frequency range F_rng that the frequency generator 10 is able to generate. The frequency generator 10 includes a variable current source 100, a voltage drop generation unit 110, a voltage source 120, a detection unit 130, a conversion unit 140, and an oscillating circuit 150. The variable current source 100 selectively outputs a current I among the multiple currents according to a control signal CS. The voltage source 120 is used for generating a maximum reference voltage Vmax and a minimum reference voltage Vmin to output a voltage range V_rng. The detection unit 130 is coupled to the voltage drop generation unit 110 and the variable current source 100 and is used for outputting the control signal CS to the variable current source 100 according to a relationship between a voltage drop Vdetect and the voltage range V_rng. The voltage drop generation unit 110 is coupled to the variable current source 100 and the detection unit 130, for generating a voltage drop according to the current and providing the voltage drop to the detection unit 130. The conversion unit 140 is coupled to the voltage drop generation unit 110 and used for outputting a digital code DC according to the relationship between the voltage drop Vdetect and the voltage range V_rng. The oscillating circuit 150 is coupled to the conversion unit 140 to generate the frequency f_target according to the digital code DC.

The variable current source 100 outputs the current I to the voltage drop generation unit 110 to generate the voltage drop Vdetect. The detection unit 130 detects whether the voltage drop Vdetect is within the voltage range V_rng or not. If the voltage drop Vdetect falls outside the voltage range V_rng, the detection unit 130 outputs the control signal CS to the variable current source 100 to adjust a current value of the current I. If the voltage drop Vdetect falls within the voltage range V_rng, the conversion unit 140 outputs the digital code DC. The oscillating circuit 150 generates the frequency f_target according to the digital code DC. Consequently, the present invention gradually adjusts the current (e.g. the voltage drop over an external resistor) to avoid implementation challenges due to the large variation in current, and further generates an accurate frequency having a wide frequency range.

Please note that FIG. 1 is just one embodiment of the present invention. Modifications can be made by those skilled in the art according to different requirements, and are not restricted herein. Please refer to FIG. 2, which is a schematic diagram of a frequency generator 20 according to an embodiment of the present invention. The frequency generator 20 is used for implementing the frequency generator 10 to generate a frequency f_target_2, which is within a frequency range F_rng_2 that the frequency generator 20 is able to generate. The frequency generator 20 includes a variable current source 200, an external resistor R, a voltage source 220, a detection unit 230, a conversion unit 240, and an oscillating circuit 250. The external resistor R can implement the voltage drop unit 110 shown in FIG. 1 and provides a voltage drop Vdetect_2 according to a current I2. In addition, using a mathematical relationship illustrating that resistance is inversely proportional to frequency (f=K/R, where K is a constant), the resistance of the external resistor R can be determined. The variable current source 200, the voltage source 220, the detection unit 230, the conversion unit 240 and the oscillating circuit 250 correspond to the variable current source 100, the voltage source 120, the detection unit 130, the conversion unit 140 and the oscillating circuit 150 shown in FIG. 1, respectively.

Figure 2:
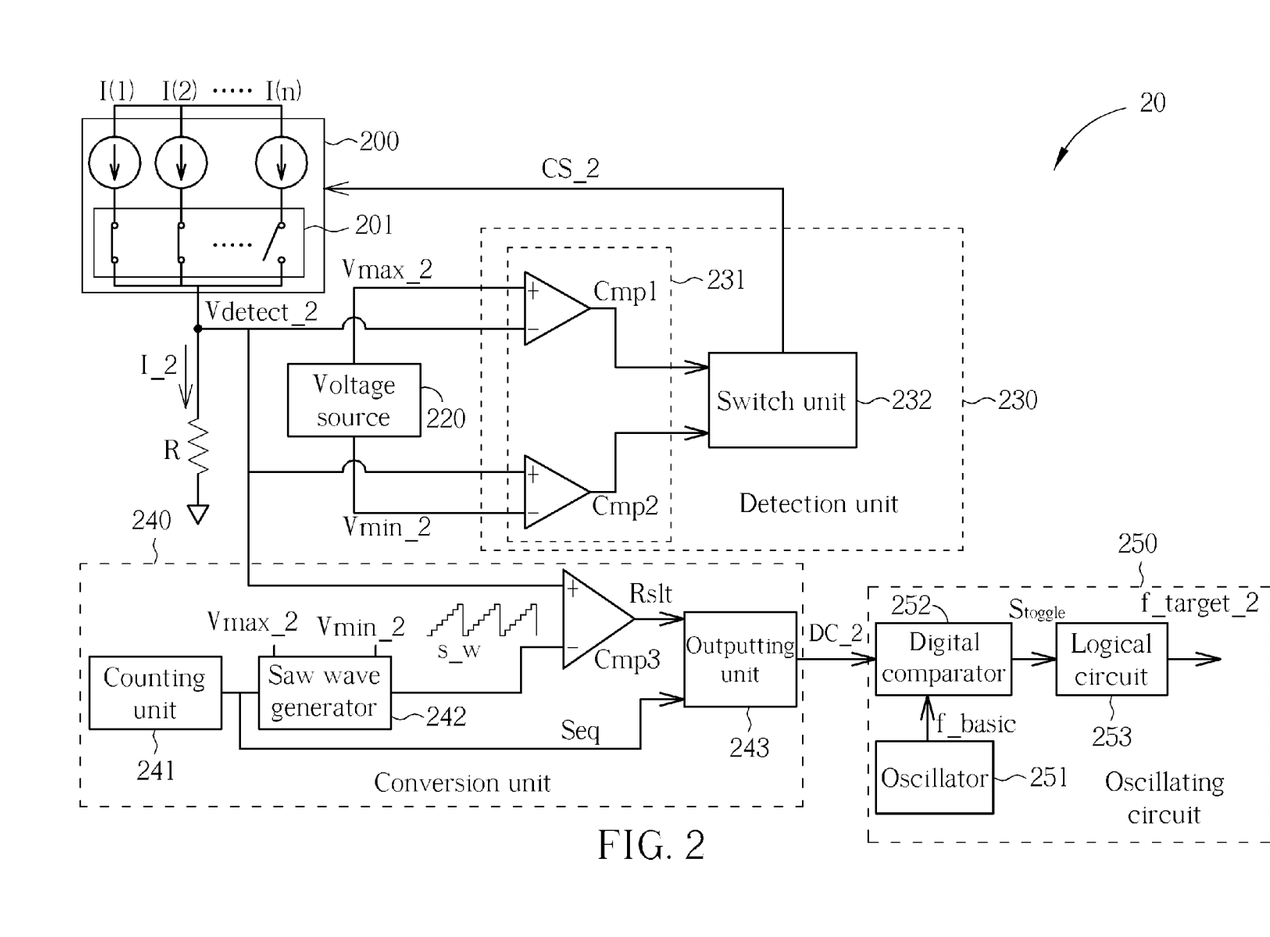
FIG. 2 is a schematic diagram of a frequency generator according to an embodiment of the present invention.

Similarly, the voltage generator 220 is used for generating a maximum reference voltage Vmax_2 and a minimum reference voltage Vmin_2 to output a voltage range V_rng_2. In FIG. 2, the variable current source 200 includes current sources I(1)~I (n) and a switch module 201. The current sources I(1)~I (n) are used for generating n currents. The switch module 201 is coupled between the external resistor R and the current sources I(1)~I (n) and is used for selecting a current source among the current sources I(1)~I(n) according to a control signal CS_2 to output the current I2 to the external resistor R. The detection 230 includes a comparison unit 231 and a switch unit 232. The comparison unit 231 is coupled to the external resistor R and used for comparing the voltage drop Vdetect_2 with the voltage range V_rng_2. The switch unit 232 is coupled to the comparison unit 231, and used for generating the control signal CS_2 to the variable current source 200 when the voltage drop Vdetect_2 is outside the voltage range V_rng_2. The comparison unit 231 includes a comparator Cmp1 and a comparator Cmp2. The comparator Cmp1 is coupled between the external resistor R and the voltage source 220, and is used for comparing the voltage drop Vdetect_2 with the maximum reference voltage Vmax_2.

The comparator Cmp2 is coupled between the voltage source 220 and the external resistor R, and is used for comparing the voltage drop Vdetect_2 with the minimum reference voltage Vmin_2. The switch unit 232 can be implemented by a counter to indicate that the variable current source 200 should switch to the different current source. When the voltage drop Vdetect_2 is greater than the maximum reference voltage Vmax_2, the counter counts down and outputs the control signal CS_2 to inform the variable current source 200 of switching to the current source that provides a smaller current. When the voltage drop Vdetect_2 is less than the minimum reference voltage Vmax_2, the counter counts up and outputs the control signal CS_2 to inform the variable current source 200 of switching to the current source that provides a larger current. The conversion unit 240 includes a counting unit 241, a saw wave generator 242, a comparator Cmp3, and an outputting unit 243. The counting unit 241 is used for outputting an accumulation sequence Seq, which can be represented in binary form. The saw wave generator 242 is used for outputting a saw wave s_w according to the accumulated sequence Seq and the voltage range V_rng_2. The amplitude of the saw wave s_w is identical to the voltage range V_rng_2. The comparator Cmp3 is used for comparing the voltage drop Vdetect_2 with the saw wave s_w to obtain a comparison result Rslt.

When the comparison result Rlst is high, this means that the voltage drop Vdetect_2 falls within the amplitude of the saw wave s_w, and the outputting unit 243 therefore outputs the accumulation sequence Seq to generate the digital code DC_2. The outputting unit 243 could be a buffer or any electronic component which is capable of storing the digital code DC_2. The oscillating circuit 250 includes an oscillator 251, a digital comparator 252 and a logical circuit 253. The oscillator 251 is used for generating a fundamental frequency f_basic. The fundamental frequency f_basic is a multiple of the frequency f_target_2. The digital comparator 252 is coupled to the oscillator 241 and the outputting unit 243, and is used for generating the frequency f_target_2 according to a toggle signal $S_{toggle}$.

Please note that the number of current sources, n, can be defined by the user, based on practical hardware requirements. In addition, the present invention determines the ratio between each current source I(1)~I (n), depending on the ratio of a maximum frequency F_max of the frequency range F_rng_2 to a minimum frequency F_min of the frequency range F_rng_2, such that the currents of the current sources I(1)~I (n) form a geometric sequence. In other words, the $n^{th}$ root of the ratio of the maximum frequency F_max to the minimum frequency F_min is equal to a common ratio r of the geometric sequence. Taking the frequency range F_rng_2 of 1 Hz up to 100 Hz as an example, the ratio of the maximum frequency F_max to the minimum frequency F_min is 100. If the variable current source 200 consists of two current sources (e.g. n=2), then current I(2) is ten times the current I(1) (e.g. r=$\sqrt{100}$=10). If the variable current source consists of four current sources (e.g. n=4), then I(4)=3.16 I(3); I(3)

=3.16 I(2); I(2)=3.16 I(1) (e.g. r=$\sqrt[4]{100}$ =3.16). Furthermore, the present invention divides the frequency range F_rng_2 and a resistance range R_rng_2 into n groups to correspond to the current sources me (1)~I (n), which satisfies the equation:

$$r = \frac{f_{max}}{f_{min}} = \frac{r_{max}}{r_{min}} = \frac{I(n+1)}{I(n)} = \sqrt[n]{\frac{F\_max}{F\_min}}$$

Where, $f_{max}$ and $f_{min}$ are the maximum and minimum frequencies of each group, respectively; and $r_{max}$ and $r_{min}$ is the maximum and minimum resistances of each group, respectively.

Figure 3:
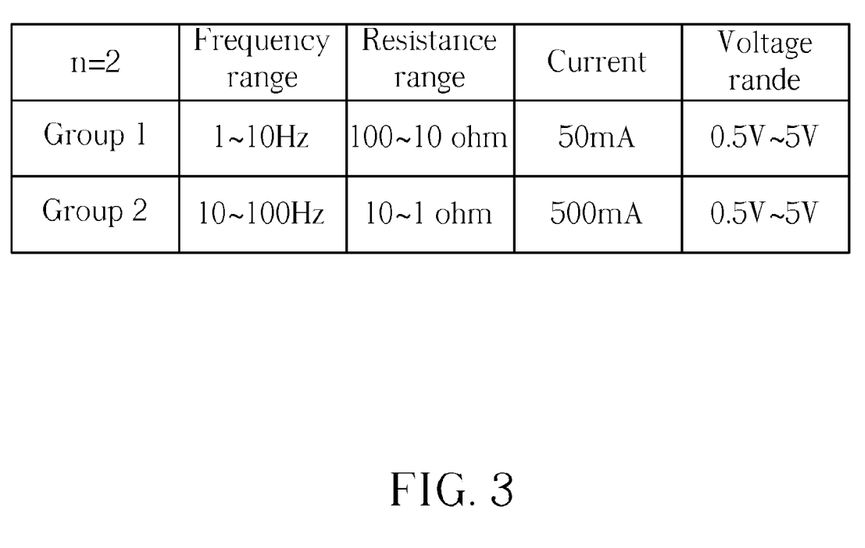
FIG. 3 is a table according to an embodiment of the present invention.

Please refer to FIG. 3, which is a table 30 according to an embodiment of the present invention. The table 30 is used for showing corresponding relationships between the frequency range F_rng_2, a resistance range R_rng_2, current sources I(1)~I(n) and the voltage range V_rng_2. Through the inversely proportional relationship between resistance and frequency (f=K/R, where K is a constant), the resistance range R_rng_2 corresponds to the frequency range F_rng_2. In the table 30, the frequency range of 1 Hz-100 Hz is divided into two groups 1 Hz-10 Hz and 10 Hz-100 Hz corresponding to the current sources 50 mA and 500 mA, respectively. The resistance range 100 ohm~1 ohm is also divided into two groups 100 ohm~10 ohm and 10 ohm~1 ohm corresponding to the current sources 50 mA and 500 mA, respectively. In addition, taking group 1 as an example, the maximum reference voltage (Vmax_2=5V) and the minimum reference voltage (Vmin_2=0.5V) are equal to the maximum resistance (100 ohm) and the minimum resistance (10 ohm) multiplied by current (50 mA), respectively. As seen in the table 30, the voltage ranges of each group are the same in a specified range.

The frequency generator 20 needing to generate the frequency f_target_2 of 75 Hz is used in the following as an example of the workings of the present invention. The external resistor is determined to be 1.33 ohm through the inversely proportional relationship of resistance and frequency (f=K/R, where K=100). For convenience, please refer to the table 30. To begin with, the embodiment of the present invention selects the current of 50 mA in the group 1 to charge the external resistor R. As a result, the voltage drop Vdetct_2 over the external resistance R is 0.0665V. The switch unit 132 is a binary counter with an initial value of "00". Since the voltage drop (Vdetect_2=0.0665V) is less than the minimum reference voltage (Vmin_2=0.5V), the switch unit 132 becomes "01", and thereby the control signal CS_2 is output to inform the variable current source 200 of switching to a larger current source. After the variable current source 200 receives the control signal CS_2, the current 500 mA in the group 2 is selected, floating through the external resistor R. As a result, the voltage drop Vdetect_2 rises to 0.665V, which falls within the amplitude of the saw wave s_w.

Figure 4:
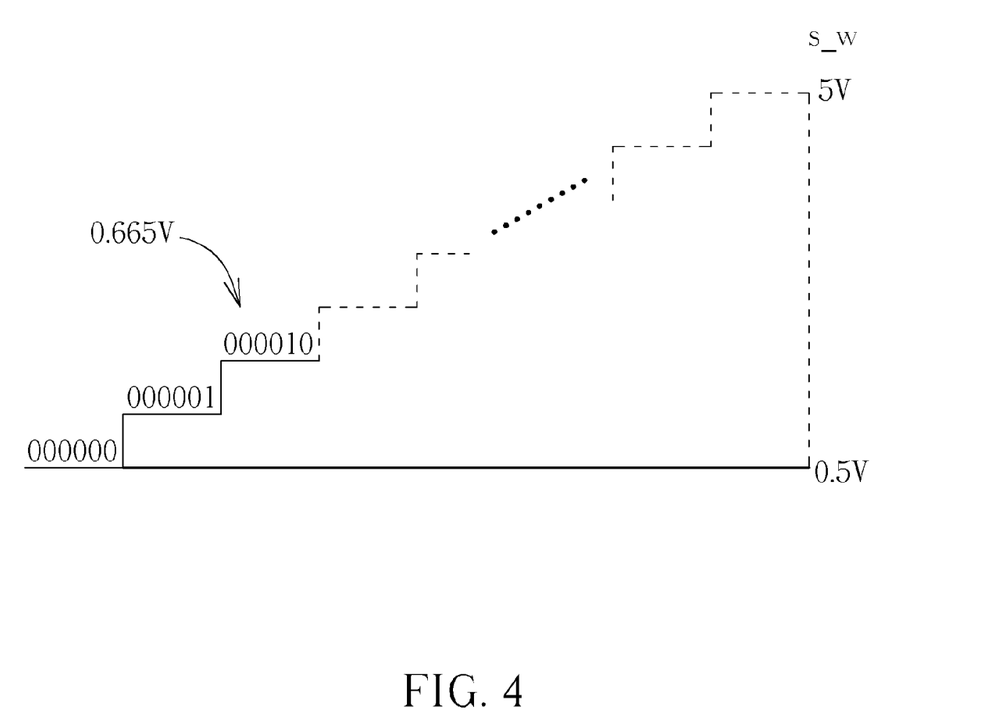
FIG. 4 is a waveform of a saw wave according to an embodiment of the present invention.

Please refer to FIG. 4, which is a waveform 40 of the saw wave s_w according to an embodiment of the present invention. The wave form 40 is a six bits digital waveform, scaled in sixty-four levels. The voltage drop Vdetect_2 is inputted to one input terminal of the comparator Cmp3 and the saw wave s_w is inputted to the other input terminal of the comparator Cmp3. Since the voltage drop 0.665V is within the amplitude of the saw wave s_w (0.5V-5V), when the saw wave s_w meets the voltage drop Vdetect_2 during the rising time, the comparator Cmp3 outputs a high level signal. Meanwhile, the outputting unit 260 records the corresponding accumulation sequence Seq "000010" according to the high level signal and outputs the digital code DC_2 "000010". The digital comparator 252 finds the frequency f_target_2 in the corresponding form, for example, digital codes, and outputs the toggle signal $S_{toggle}$ according to the frequency f_target_2 in the corresponding form and a fundamental frequency f_basic. The logical circuit 253 could be implemented by a set/reset (SR) flip flop. The toggle signal $S_{toggle}$ is inputted to the S terminal and the R terminal of the SR flip flop. As a result, the frequency f_target_2 can be generated by setting and resetting operations, triggering the set and reset terminal by turns. The detailed operations of the oscillating circuit 150 are well known by those in the art, and thus not elaborated on herein.

Figure 5:
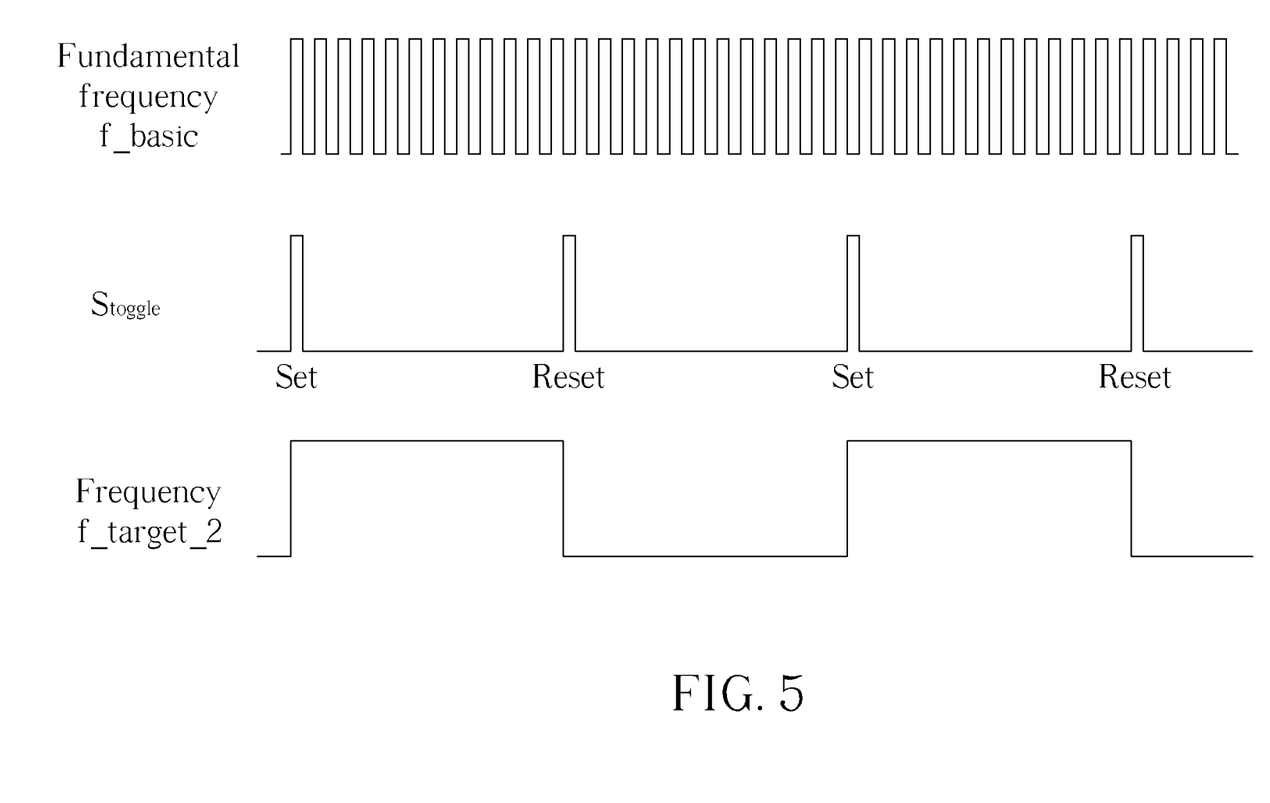
FIG. 5 is a timing diagram according to an embodiment of the present invention.

Please refer to FIG. 5, which is a timing diagram 50 according to an embodiment of the present invention. The timing diagram 50 illustrates the relationship between the toggle signal $S_{toggle}$, the fundamental frequency f_basic and the frequency f_target_2. When the frequency generator is capable of generating the frequency with a wide frequency range, the generated frequency is not quite accurate due to a minute error of the resistance in the prior art. The present invention, however, uses a detection unit to detect whether the voltage drop over the external resistor is within the voltage range or not, and thereby adjusts the current to increase or decrease the voltage drop over the external resistor. Further, the voltage drop can fall within the voltage range. In other words, increasing or decreasing the voltage over the external resistor represents searching for a proper voltage range for the desired frequency. Namely, when the frequency range is wide, the embodiment of the present invention can reduce the frequency error by an approximating method.

Figure 6:
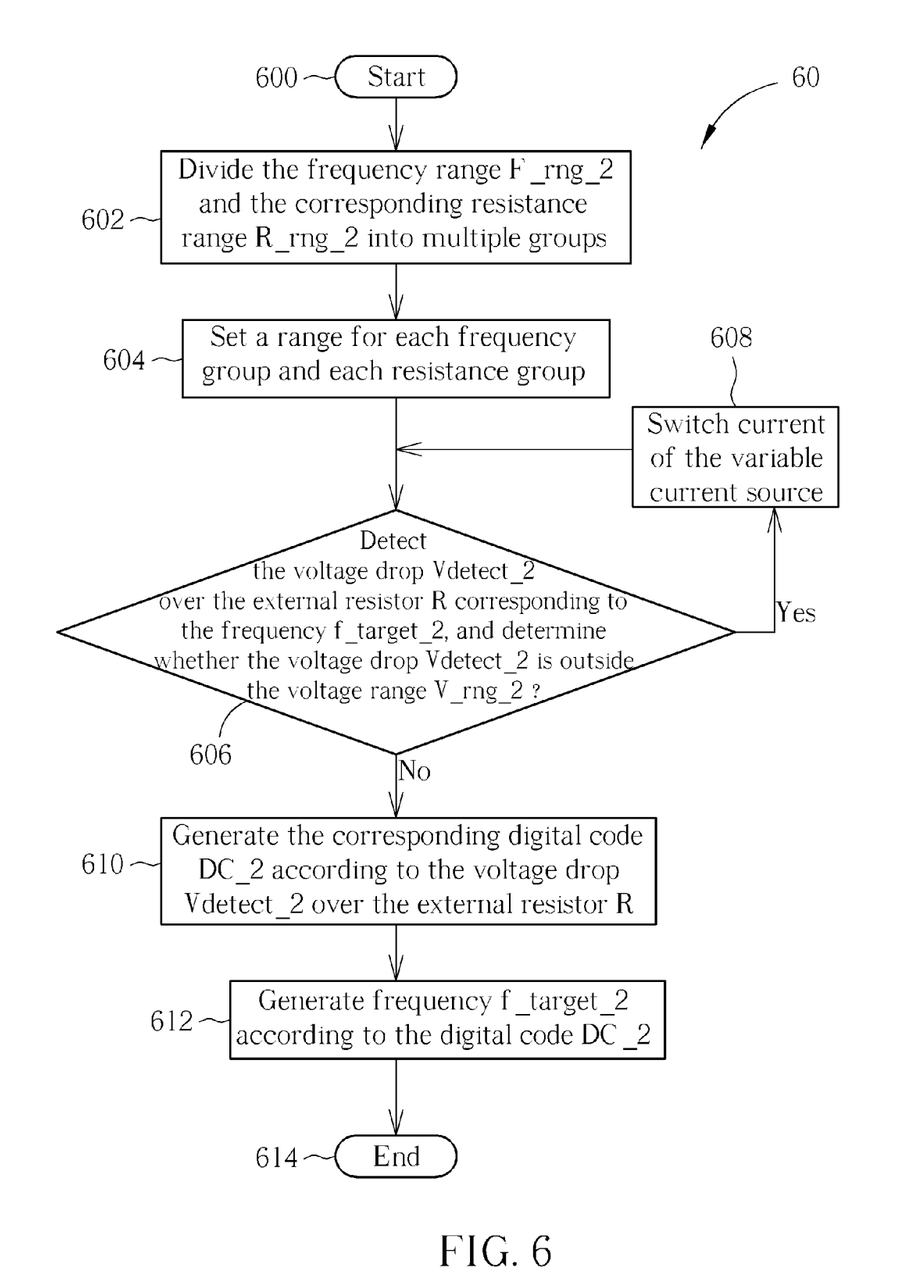
FIG. 6 is a flow chart of a process according to an embodiment of the present invention.

The main principle of the present invention is to determine the voltage range, the size of the current sources, the selection of the current value, and related parameters according to the operation of the frequency generator 20. Therefore, the related operation of the frequency generator 20 can be summarized into a process. Please refer to FIG. 6, which is a flow chart of a process 60 according to an embodiment of the present invention. The process 60 is used for generating the frequency f_target_2 for the frequency generator 20. The process 60 includes the following steps:

Step 600: Start.

Step 602: Divide the frequency range F_rng_2 and the corresponding resistance range R_rng_2 into multiple groups.

Step 604: Set a range for each frequency group and each resistance group.

Step 606: Detect the voltage drop Vdetect_2 over the external resistor R corresponding to the frequency f_target_2, and determine whether the voltage drop Vdetect_2 is outside the voltage range V_rng_2; if so, go to step 608; otherwise, go to step 610.

Step 608: Switch current of the variable current source 200; go back to step 606.

Step 610: Generate the corresponding digital code DC_2 according to the voltage drop Vdetect_2 over the external resistor R.

Step 612: Generate frequency f_target_2 according to the digital code DC_2.

Step 614: End.

The process 60 represents operations of the frequency generator 20: related statements regarding details of the operation can be found above and are thus omitted herein.

To sum up, the present invention uses a variable current source to output current to the voltage drop generation unit for obtaining the voltage drop. Then, the detection unit detects whether the voltage drop is within the voltage range. If the voltage drop is outside the voltage range, the detection unit outputs the control signal to adjust the current. If the voltage drop is within the voltage range, the conversion unit outputs the digital code. The oscillating circuit generates the target frequency according to the digital code. The present invention searches for a proper frequency range by adjusting the variable current source and further generates an accurate frequency within a wide range as well as avoiding implementation problems on the circuit due to a large current variation.

Those skilled in the art will readily observe that numerous modifications and alterations of the device and method may be made while retaining the teachings of the invention.

What is claimed is:

1. A frequency generator for generating a frequency within a frequency range, the frequency generator comprising:
   a variable current source for selectively outputting a current among a plurality of currents according to a control signal;
   a voltage drop generation unit coupled to the variable current source, for generating a voltage drop according to the current;
   a voltage source for generating a maximum reference voltage and a minimum reference voltage in order to output a voltage range;
   a detection unit coupled to the voltage drop generation unit and the variable current source, for detecting whether the voltage drop generated by the voltage drop generation unit is within the voltage range or not and outputting the control signal to the variable current source according to a relationship between the voltage drop and the voltage range;
   a conversion unit coupled to the voltage drop generation unit, for outputting a digital code according to the relationship between the voltage drop and the voltage range; and
   an oscillating circuit coupled to the conversion unit, for generating the frequency according to the digital code.

2. The frequency generator of claim 1, wherein the variable current source comprise:
   a plurality of current sources for generating the plurality of currents; and
   a switch module coupled between the plurality of current sources and the voltage drop generation unit, for selecting a current source from the plurality of current sources according to the control signal and outputting the current to the voltage drop generation unit.

3. The frequency generator of claim 1, wherein current volumes of the currents form a geometric sequence.

4. The frequency generator of claim 3, wherein a common ratio of the geometric sequence is equal to a ratio of the maximum reference voltage of the voltage range to the minimum reference voltage of the voltage range.

5. The frequency generator of claim 3, wherein the $X^{th}$ power of the common ratio is equal to a ratio of a maximum frequency to a minimum frequency.

6. The frequency generator of claim 5, wherein X is the number of currents.

7. The frequency generator of claim 1, wherein the detection unit comprises:
   a comparison unit coupled to the voltage drop generation unit, for comparing the voltage drop with the voltage range; and
   a switch unit coupled to the comparison unit, for generating the control signal for the variable current source when the voltage drop falls outside the voltage range.

8. The frequency generator of claim 7, wherein the comparison unit comprises:
   a first comparator coupled to the voltage source and the voltage drop generation unit, for comparing the voltage drop with the maximum reference voltage within the voltage range; and
   a second comparator coupled to the voltage source and the voltage drop generation unit, for comparing the voltage drop with the minimum reference voltage within the voltage range.

9. The frequency generator of claim 7, wherein the switch unit is a counter.

10. The frequency generator of claim 1, wherein the conversion unit comprises:
    a counting unit for outputting an accumulated sequence;
    a saw wave generator for outputting a saw wave according to the voltage range and the accumulated sequence;
    a third comparator for comparing the voltage drop with the saw wave to generate a comparison result;
    an outputting unit for inputting a number in the accumulated sequence according to the comparison result, to generate a digital code.

11. The frequency generator of claim 10, wherein the saw wave generator determines amplitude of the saw wave according to the voltage range.

12. The frequency generator of claim 11, wherein the outputting unit outputs the number in the accumulated sequence to generate the digital code when the voltage drop falls within the amplitude of the saw wave.

13. The frequency generator of claim 1, wherein the oscillating circuit comprises:
    an oscillator for generating a fundamental frequency;
    a digital comparator coupled to the oscillator and the conversion unit, for comparing the fundamental frequency with the digital code to generate a toggle signal; and
    a logical circuit coupled to the digital comparator, for generating the frequency according to the toggle signal.

14. The frequency generator of claim 13, wherein the fundamental frequency is a multiple of the frequency.

15. The frequency generator of claim 13, wherein the logical circuit is a set/reset flip flop.

16. The frequency generator of claim 1, wherein the voltage drop generation unit is a resistor.

* * * * *